United States Patent
Yamazaki et al.

(10) Patent No.: US 8,038,511 B2
(45) Date of Patent: Oct. 18, 2011

(54) METHOD FOR MACHINING CHAMFER PORTION OF SEMICONDUCTOR WAFER AND METHOD FOR CORRECTING GROOVE SHAPE OF GRINDING STONE

(75) Inventors: Eiichi Yamazaki, Fukushima (JP); Takashi Sekine, Fukushima (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 798 days.

(21) Appl. No.: 12/086,330

(22) PCT Filed: Dec. 13, 2006

(86) PCT No.: PCT/JP2006/324814
§ 371 (c)(1),
(2), (4) Date: Jun. 11, 2008

(87) PCT Pub. No.: WO2007/069629
PCT Pub. Date: Jun. 21, 2007

(65) Prior Publication Data
US 2009/0163119 A1    Jun. 25, 2009

(30) Foreign Application Priority Data
Dec. 15, 2005 (JP) .................. 2005-362031

(51) Int. Cl.
*B24B 1/00* (2006.01)
(52) U.S. Cl. ....... 451/43; 451/56; 125/11.04; 125/11.18
(58) Field of Classification Search .......... 451/41, 451/43, 56; 125/11.04, 11.18
See application file for complete search history.

(56) References Cited

U.S. PATENT DOCUMENTS

| | | | |
|---|---|---|---|
| 2,720,062 A * | 10/1955 | Fouquet | 451/21 |
| 5,209,020 A * | 5/1993 | Feisel | 451/11 |
| 5,595,528 A * | 1/1997 | Becker | 451/72 |
| 7,189,149 B2 * | 3/2007 | Katayama et al. | 451/56 |
| 2005/0112999 A1 * | 5/2005 | Katayama et al. | 451/5 |

FOREIGN PATENT DOCUMENTS

| | | |
|---|---|---|
| JP | A-05-152259 | 6/1993 |
| JP | A-2000-167753 | 6/2000 |
| JP | A-2001-001243 | 1/2001 |
| JP | A-2005-153085 | 6/2005 |

* cited by examiner

*Primary Examiner* — Maurina Rachuba
(74) *Attorney, Agent, or Firm* — Oliff & Berridge PLC (57) ABSTRACT

According to the present invention, in a method for subjecting a roughly ground chamfer portion of a semiconductor wafer to helical grinding by relatively inclining the wafer and a second grinding stone to perform precise grinding, an edge portion of a discoid truer is formed into a vertically asymmetrical groove shape of a first grinding stone by using the first grinding stone having a vertically asymmetrical groove formed on a periphery thereof to grind the edge portion of the truer by the groove of the first grinding stone without being relatively inclined, a groove is formed on a periphery of the second grinding stone by relatively inclining the truer and the second grinding stone to subject the second grinding stone to helical grinding, and the chamfer portion of the wafer is precisely ground based on helical grinding by relatively inclining the semiconductor wafer with respect to a direction of the groove formed on the periphery of the second grinding stone. As a result, there is provided the method for machining a chamfer portion of the semiconductor wafer, which can machine the chamfer portion of the wafer into a vertically symmetrical shape when subjecting the chamfer portion of the semiconductor wafer to helical grinding, e.g. a resin grinding stone and the like.

21 Claims, 9 Drawing Sheets

METHOD FOR MACHINING CHAMFER PORTION OF SEMICONDUCTOR WAFER AND METHOD FOR CORRECTING GROOVE SHAPE OF GRINDING STONE

TECHNICAL FIELD

The present invention relates to a method for precisely grinding a chamfer portion of a semiconductor wafer, e.g., a silicon wafer, based on helical grinding.

BACKGROUND ART

A semiconductor wafer, e.g., a silicon wafer, for use in fabrication of a semiconductor device and the like is chamfered by grinding an edge portion in order to avoid chipping due to handling, and also subjected to mirror edge polishing based on polishing as a particle generation countermeasure in a device process in recent years. However, when a mechanical damage in the chamfer portion is deep, a damage or a grinding striation remains even though mirror edge polishing is performed, which results in a factor of particle generation.

Thus, as a method for reducing a mechanical damage in the chamfer portion, there is a method for performing so-called helical grinding with respect to a chamfer portion of a wafer, for example, while inclining a resin bond grinding stone (a resin grinding stone) with respect to the wafer (see Japanese Patent Application publication No. H05-152259).

Figure 3:
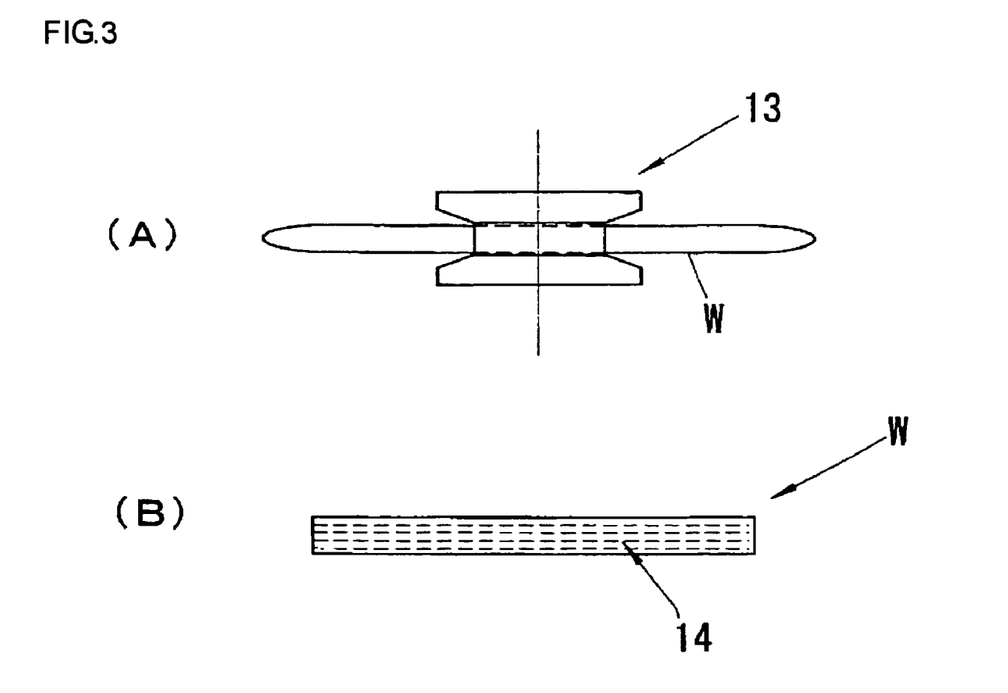
FIG. 3 is schematic views showing a state (A) where the chamfer portion of the semiconductor wafer is ground by using the resin grinding stone based on a regular method and a surface state (B) of the chamfer portion of the wafer after grinding.

In regular grinding, a chamfer portion is ground in a state where a main surface of a wafer W becomes vertical to a rotating axis of a resin grinding stone 13 as shown in FIG. 3(A), but in this case, grinding striations 14 in a circumferential direction are apt to be generated in the chamfer portion as shown in FIG. 3(B).

Figure 4:
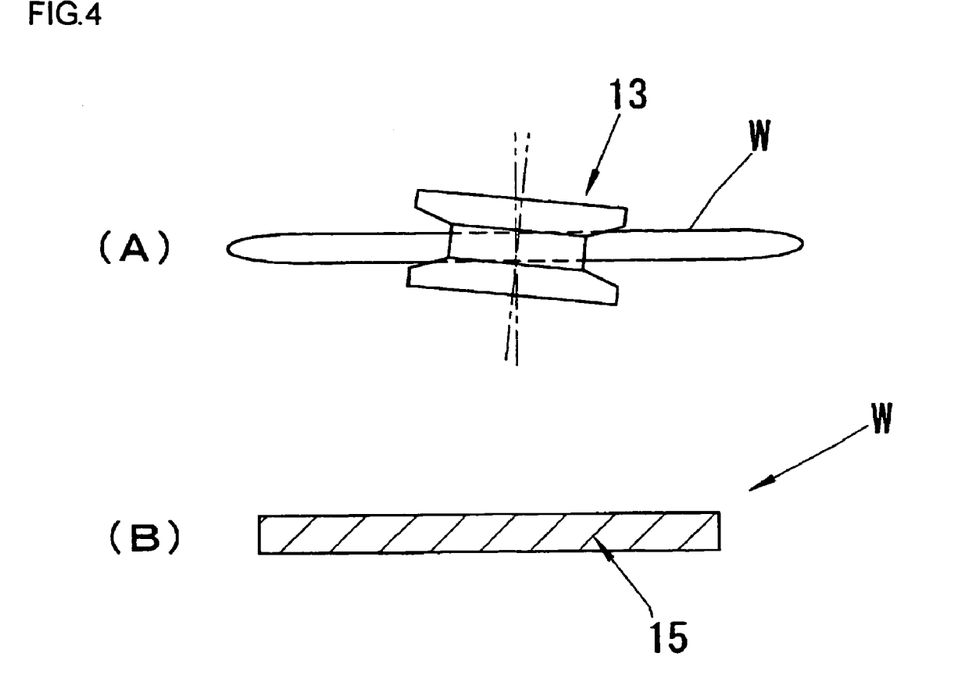
FIG. 4 is schematic views showing a state (A) where the chamfer portion of the semiconductor wafer is subjected to helical grinding using the resin grinding stone and a surface state (B) of the chamfer portion of the wafer after grinding.

On the other hand, when performing helical grinding, the chamfer portion of the wafer W is ground in a state where the rotating axis of the resin grinding stone 13 is inclined with respect to a rotating axis of the wafer W as shown in FIG. 4(A). When such helical grinding is performed, while weak grinding striations 15 are generated in an oblique direction in the chamfer portion of the wafer W as shown in FIG. 4(B), the chamfer portion of the wafer W contacts with the surface of the grinding stone 13, thus an effect of improving surface roughness of the chamfer portion as compared with regular grinding is obtained.

However, if the chamber portion of the wafer is subjected to helical grinding by using the resin grinding stone as explained above, a reduction in damages in the chamfer portion of the wafer and an increase in a grinding stone life can be achieved, whereas there is a problem that vertical symmetry of the chamfer portion of the wafer considerably collapses. When the chamfer portion is continuously machined in particular, upper and lower angles of a groove of the resin grinding stone gradually vary, and asymmetry of the chamfer portion of the wafer is thereby more increased.

DISCLOSURE OF INVENTION

In view of the above described problems, a main object of the present invention is to provide a method for machining a chamfer portion of a semiconductor wafer, which can chamfer the chamfer portion of the wafer into a vertically symmetrical shape when subjecting the chamber portion of the semiconductor wafer to helical grinding by using, e.g., a resin grinding stone.

According to the present invention, there is provided a method for machining a chamfer portion of a semiconductor wafer that is a method for subjecting a roughly ground chamfer portion of a semiconductor wafer to helical grinding by relatively inclining the wafer and a second grinding stone to perform precise grinding, comprising: forming an edge portion of a discoid truer into a vertically asymmetrical groove shape of a first grinding stone by using the first grinding stone having a vertically asymmetrical groove formed on a periphery thereof to grind the edge portion of the truer without being relatively inclined; forming a groove on a periphery of the second grinding stone by relatively inclining the truer and the second grinding stone to subject the second grinding stone to helical grinding; and precisely grinding the chamfer portion of the wafer based on helical grinding by relatively inclining the semiconductor wafer with respect to a direction of the groove formed on the periphery of the second grinding stone.

If the first grinding stone having the vertically asymmetrical groove formed on the periphery thereof is used to form the groove on the second grinding stone based on helical grinding through the truer having an edge portion formed thereon, the substantially vertically symmetrical groove can be formed on the periphery of the second grinding stone. Furthermore, if the second grinding stone is used to subject the chamfer portion of the wafer to helical grinding, the chamfer portion of the wafer can be machined into the substantially vertically symmetrical shape.

In this case, a metal grinding stone can be used as the first grinding stone, and a resin grinding stone can be used as the second grinding stone.

The resin grinding stone is preferable for precise grinding for the chamfer portion of the semiconductor wafer. The metal grinding stone is harder than the resin grinding stone and preferable for machining of the truer.

In this case, it is preferable that, when the truer and the second grinding stone are relatively inclined to subject the second grinding stone to helical grinding, upper and lower angles of the groove of the first grinding stone are determined in such a manner that the vertically asymmetrical shape of the edge portion of the truer can be offset and a vertically symmetrical groove can be formed on the periphery of the second grinding stone.

If the upper and lower angles of the groove of the first grinding stone are determined to subject the second grinding stone to helical grinding through the truer, the groove having the substantially vertically symmetrical shape can be more certainly formed.

As the truer, a material formed by combining abrasive grains consisting of a silicon carbide through a phenol resin can be used.

The truer formed by combining abrasive grains consisting of the silicon carbide through the phenol resin can be preferably machined by using the first grinding stone a metal grinding stone and the like. On the other hand, the second grinding stone, e.g., a resin grinding stone and the like can be preferably machined by using the machined truer.

Machining a silicon wafer as the semiconductor wafer is preferable.

The silicon wafer is most frequently used for fabrication of a semiconductor device and the like, and the present invention is very useful for machining the chamfer portion of the silicon wafer.

A target value of the upper and lower angles of the chamfer portion of the semiconductor wafer after precise grinding based on helical grinding using the second grinding stone can be set to 22 degrees.

When the present invention is applied, each of the upper and lower angles of the chamfer portion becomes very close to 22 degrees as a general target, thereby obtaining the chamfer portion having the substantially vertical symmetrical shape can be machined.

Moreover, rough grinding may be performed before the chamfer portion of the semiconductor wafer is subjected to precise grinding based on helical grinding using the second grinding stone so that the chamfer portion of the wafer has the vertically asymmetrical shape.

In the present invention, the second grinding stone having the substantially vertically symmetrical groove formed thereon can be used to subject the wafer to helical grinding, but in this case, the groove shape of the second grinding stone gradually varies due to continuous machining. Thus, if the chamfer portion is subjected to rough grinding in advance in such a manner that the side of the chamfer portion of the wafer that is apt to have a large angle after helical grinding has a small angle, the chamfer portion can be certainly machined into one having the substantially vertically symmetrical shape after helical grinding.

Additionally, according to the present invention, there is provided a method for correcting a groove shape of a second grinding stone that is a method for correcting a groove shape of a second grinding stone when a semiconductor wafer having a roughly ground chamfer portion and the second grinding stone having a groove formed on a periphery thereof are relatively inclined and the chamfer portion of the wafer is subjected to helical grinding using the groove of the second grinding stone to perform precise grinding, comprising: forming an edge portion of a discoid truer into a vertically asymmetrical groove shape of a first grinding stone by using the first grinding stone having a vertically asymmetrical groove formed on a periphery thereof to grind the edge portion of the truer; and correcting the groove shape of the second grinding stone by relatively inclining the truer and the second grinding stone to subject the second grinding stone to helical grinding.

If the second grinding stone is used to continuously machine the chamfer portion of the wafer based on helical grinding, the groove of the second grinding stone for grinding is worn out or clogged, and hence the groove shape gradually varies. Thus, when the first grinding stone having the vertically asymmetrical groove formed on the periphery thereof is used to form the edge portion of the truer and the groove shape of the second grinding stone is corrected through the truer based on helical grinding, the groove of the second grinding stone can be reproduced into the substantially vertically symmetrical shape.

In the present invention, when subjecting the chamber portion of the semiconductor wafer to helical grinding, the first grinding stone, e.g., a metal grinding stone having a vertically asymmetrical groove formed on a periphery thereof is used to machine the truer, and the substantially vertically symmetrical groove is formed or corrected on the periphery of the second grinding stone, e.g., a resin grinding stone based on helical grinding using the truer. Further, when the second grinding stone is used to subject the chamfer portion of the wafer to helical grinding, the chamfer portion of the wafer can be machined into a substantially vertically symmetrical shape.

BEST MODE(S) FOR CARRYING OUT THE INVENTION

Hereinafter, the present invention will be explained in detail with reference to the attached drawings.

The present inventor has examined a cause that shape of a chamfer portion of a wafer becomes vertically asymmetrical when the chamber portion of the silicon wafer is subjected to helical grinding by using a resin grinding stone (a second grinding stone).

Figure 5:
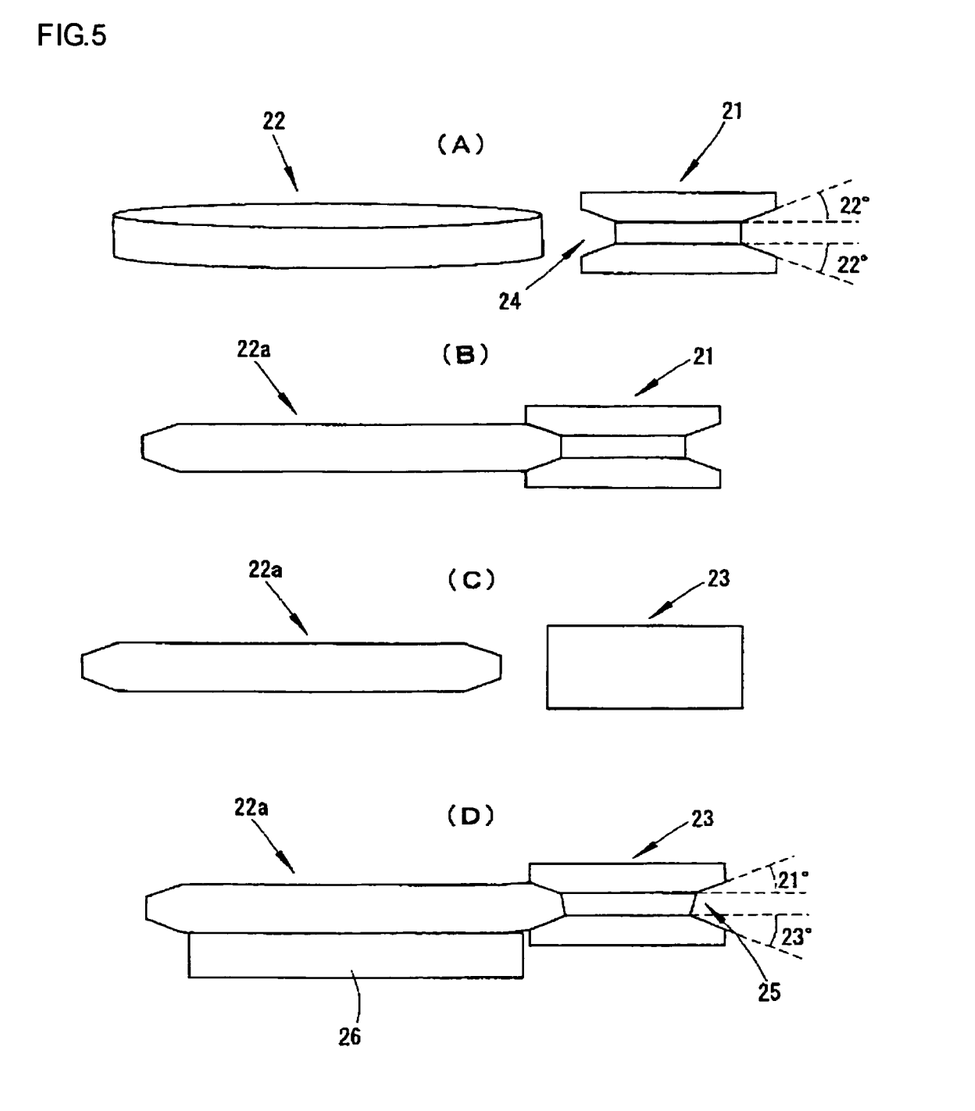
FIG. 5 is explanatory drawings showing a procedure for forming a groove on the resin grinding stone based on a conventional method.

Conventionally, for example, machining a chamfer portion of a silicon wafer in such a manner that each of upper and lower angles of the chamfer portion of the silicon wafer becomes 22 degrees, a metal grinding stone 21 having a vertically symmetrical groove 24 in which each of upper and lower angles is 22 degrees is first fabricated as a prototype (a first grinding stone) as shown in FIG. 5(A). Furthermore, a discoid truer 22 is horizontally pressed against the vertically symmetrical groove 24 of the metal grinding stone 21 to grind an edge portion of the truer 22 (FIG. 5(B)).

As a result, the edge portion of the truer 22 is formed into a vertically symmetrical shape at an angle equal to that of the groove shape of the metal grinding stone 21, that is, 22 degrees. Moreover, as shown in FIG. 5(C), a resin grinding stone 23 having no grinding groove formed thereon is obliquely attached to a helical chamfering machine, and a truer 22a having a formed edge portion is held on an absorption table 26 to perform helical grinding. That is, when the groove shape of the metal grinding stone 21 is transferred to the resin grinding stone 23 through the truer 22a in the helical chamfering machine, a groove required to grind the chamfer portion of the wafer can be formed on a periphery of the resin grinding stone 23.

However, according to the examination conducted by the present inventor, when the truer 22a having the edge portion formed into the vertically symmetrical shape is used to form or correct (truing) the groove with respect to the resin grinding stone 23, there occurs a phenomenon that the truer 22a is twisted and the edge portion is lifted up as shown in FIG. 5(D) because the resin grinding stone has inclination. Since formation or truing of the groove is carried out in this state, a groove 25 of the resin grinding stone 23 is machined into a vertically asymmetrical shape. Moreover, when the chamfer portion of the wafer is subjected to helical grinding by using the asymmetrical groove 25 of the resin grinding stone 23 in this manner, the chamfer portion is machined into a vertically asymmetrical shape.

Consequently, the present inventor has also keenly studied a method for machining a shape of a chamfer portion into a vertically symmetrical shape even when subjecting the chamber portion of the semiconductor wafer to helical grinding. As a result, it has been found that if a metal grinding stone having a vertically asymmetrical groove is used as a prototype to machine an edge portion of a truer and the vertically asymmetrical truer is used to subject a resin grinding stone to helical grinding, a groove having a substantially vertically symmetrical shape can be formed on a periphery of the resin grinding stone, and that if the chamfer portion of the semiconductor wafer is machined based on helical grinding by using the resin grinding stone, the chamfer portion of the wafer can be machined into a substantially vertically symmetrical shape, thereby bringing the present invention to completion.

An example of machining a chamfer portion of a silicon wafer will be explained bellow as a preferred embodiment.

Figure 1:
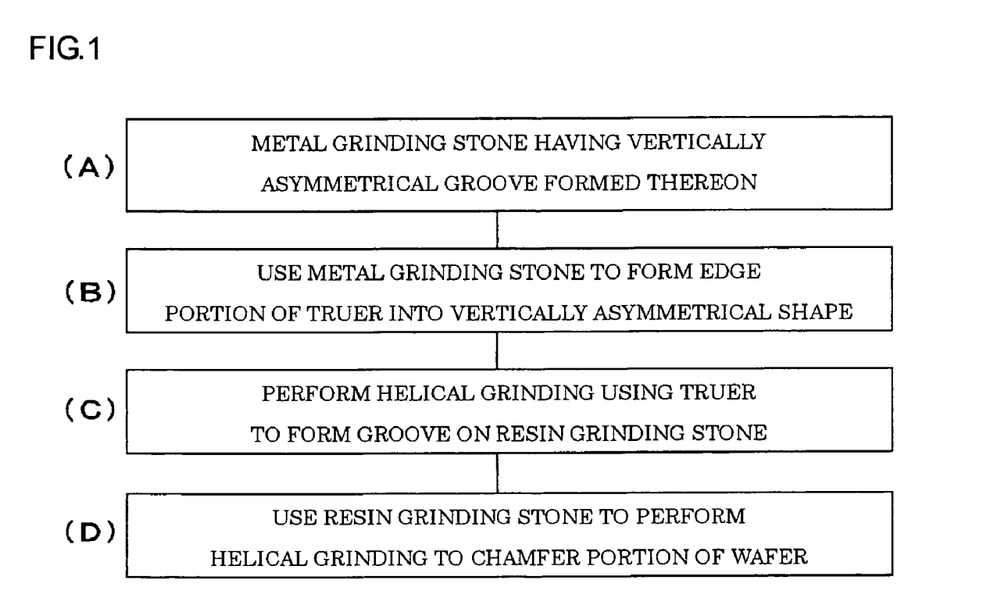
FIG. 1 is a flowchart showing a method for machining a chamfer portion of a semiconductor wafer according to the present invention.
Figure 2:
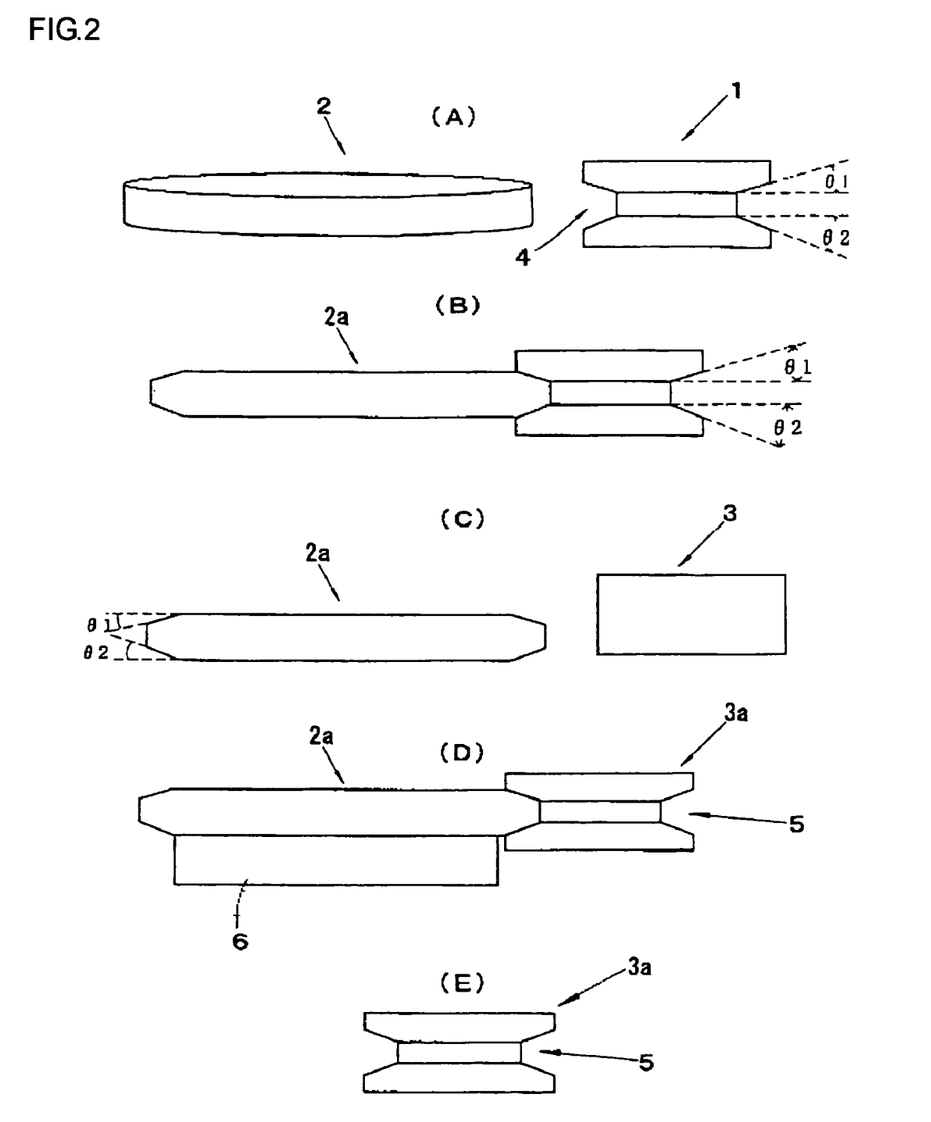
FIG. 2 is explanatory drawings showing a procedure for forming a groove on a resin grinding stone according to the present invention.

FIG. 1 is a flowchart showing an example of a process of machining a chamfer portion of a silicon wafer according to the present invention, and FIG. 2 is explanatory drawings showing a procedure for forming a groove on a resin grinding stone.

First, a metal grinding stone 1 having a vertically asymmetrical groove 4 formed thereon is prepared as a prototype (a first grinding stone) (FIG. 1(A), FIG. 2(A)). As such a metal grinding stone 1, one formed by mixing diamond abrasive grains in a main component, e.g., a metal powder of Fe, Cr, or Cu and the like, can be preferably used.

The asymmetrical groove shape of the metal grinding stone 1 is reflected in a shape of an edge portion of a truer formed by grinding using the groove 4, and affects a shape of a groove formed by using the truer to subject the resin grinding stone (a second grinding stone) to helical grinding. Therefore, each of upper and lower angles θ1 and θ2 of the groove 4 of the metal grinding stone may be determined while considering a groove shape of the resin grinding stone and the like. Specifically, it is preferable to determine the upper and lower angles θ1 and θ2 of the groove 4 of the metal grinding stone 1 in such a manner that a vertically asymmetrical shape of the edge portion of the truer is offset to enable formation of the vertically symmetrical groove on the periphery of the resin grinding stone when the resin grinding stone is ground (helical grinding) while relatively inclining the truer and the resin grinding stone.

Then, the edge portion of the discoid truer 2 is ground by using the vertically asymmetrical groove 4 of the metal grinding stone 1 without being relatively inclined, thereby forming the vertical asymmetrical shape of the metal grinding stone 1 (FIG. 1(B), FIG. 2(B)).

As a material of the truer 2, one that can be machined by the metal grinding stone 1 and can grind the resin grinding stone is adopted. For example, a material obtained by combining abrasive grains consisting of a silicon carbide through a phenol resin added a filler and the like therein if necessary and forming a resultant into a discoid truer can be preferably used.

The truer formed from the silicon carbide and the phenol resin can be preferably machined by using the metal grinding stone and, when forming or correcting the groove of the resin grinding stone, abrasion of the truer can be suppressed, and the same truer can be utilized to repeatedly subject the groove of the resin grinding stone to truing.

In machining the edge portion of the truer, while the metal grinding stone 1 having the vertically asymmetrical groove 4 formed thereon is rotated together with the discoid truer 2, and the edge portion of the truer 2 is horizontally pressed against the groove 4 of the metal grinding stone 1 to be ground. As a result, the vertically asymmetrical groove shape of the metal grinding stone 1 is transferred to the edge portion of the truer 2.

Subsequently, a truer 2a having an edge portion machined into a vertically asymmetrical shape is used to form a groove 5 on a periphery of a resin grinding stone 3 (FIGS. 2(C) and (D)). At this time, the resin grinding stone 3 is ground while relatively inclining the truer 2a and the resin grinding stone 3 in a tangential direction at a predetermined angle, thereby forming the groove 5 on the periphery of the resin grinding stone 3 (FIG. 1(C)).

As a material of the resin grinding stone 3, one that can form the groove 5 on the periphery when ground by the truer and can precisely grind a chamfer portion of a silicon wafer by the formed groove 5 is adopted. For example, a material that contains a phenol resin, an epoxy resin, a polyimide resin and the like, a polystyrene resin, or a polyethylene resin as a main component and is formed by mixing diamond abrasive grains or cubic crystal boron nitride abrasive grains in this main component can be preferably used.

When forming the groove 5 on the resin grinding stone 3, the resin grinding stone 3 is attached to a helical chamfering machine (not shown) at a predetermined inclination angle, and the truer 2a having the edge portion formed thereon is held on an adsorption table 6 of the helical chamfering machine to perform helical grinding. Incidentally, in a case where the resin grinding stone 3 is subjected to helical grinding by the truer 2a to form the groove 5, if the upper angle of the groove 5 formed on the resin grinding stone 3 tends to become small, one side of the truer 2a having the edge portion (a chamfer portion) set to a large angle θ2 is determined as an upper side to subject the resin grinding stone 3 to helical grinding, for example. When the truer 2a is used to subject the resin grinding stone 3 to helical grinding as described above, the vertical asymmetrical shape of the edge portion of the truer 2a is offset, thereby forming the groove 5 having a substantially vertically symmetrical shape on the periphery of the resin grinding stone 3a (FIG. 2(E)).

The silicon wafer is relatively inclined with respect to a direction of the groove formed on the periphery of the resin grinding stone 3a through the above described process to precisely grind the chamfer portion of the wafer based on helical grinding (FIG. 1(D)).

It is to be noted that the silicon wafer is subjected to rough chamfering by roughly grinding an edge portion thereof by using the metal grinding stone in advance. If the chamfer portion of the wafer is roughly ground in advance, the chamfer portion can be precisely ground in a short time based on helical grinding using the resin grinding stone 3a, and a life of the resin grinding stone can be prolonged. Further, when the roughly ground chamfer portion of the wafer is subjected to helical grinding by using the resin grinding stone 3a having the substantially vertically ground groove 5 formed thereon, since the silicon wafer is hard and not twisted like the truer, the groove shape of the resin grinding stone 3a is reflected in the chamfer portion of the wafer, thereby machining the chamfer portion into one having the substantially vertically symmetrical shape.

It is to be noted that, when continuous machining is carried out, the resin grinding stone 3a is worn out or clogged to change its groove shape, and vertical symmetry of the groove gradually collapses. Thus, when the vertical symmetry of the groove shape of the resin grinding stone 3a is degraded, appropriately performing helical grinding as well as the above described case of forming the groove 5 using the truer 2a, the groove shape can be corrected (truing) into one having the high vertical symmetry.

It is to be noted that rough grinding may be carried out before precisely grinding the chamfer portion of the silicon wafer based on helical grinding using the resin grinding stone 3a so that the chamfer portion of the wafer can have a slightly vertically asymmetrical shape. When the chamfer portion of the wafer is continuously machined based on helical grinding, for example, if the upper angle of the chamfer portion tends to become large, rough grinding is performed so that the upper angle of the chamfer portion of the wafer becomes small. In particular, if rough grinding is performed to provide the vertically asymmetrical shape to the chamfer portion of the wafer in accordance with a change in the groove shape of the resin grinding stone and the chamfer portion is then subjected to helical grinding using the resin grinding stone, the chamfer portion of the wafer can be continuously machined to have the substantially vertically symmetrical shape.

As explained above, when the metal grinding stone (the prototype, the first grinding stone) having the vertically symmetrical groove is used to form the substantially vertically symmetrical groove to the resin grinding stone (the second grinding stone) through the truer and the chamfer portion of the roughly ground wafer is subjected to helical grinding, thereby the chamfer portion can be machined to have the substantially vertically symmetrical shape.

Furthermore, if the groove of the resin grinding stone is subjected to truing according to the present invention the number of wafers that can be machined per a truing operation can be increased and also a life of the resin grinding stone can be prolonged, thereby increasing the number of wafers that can be machined by using the single resin grinding stone. Therefore, a cost in manufacture of the semiconductor wafer can be reduced.

Examples and Comparative Examples according to the present invention will be explained hereinafter.

EXAMPLE 1

A metal grinding stone (main components: a metal powder (Fe, Cr, Cu), diamond abrasive grains) having a vertically asymmetrical groove with an upper angle of 22 degrees and a lower angle of 21 degrees formed on a periphery thereof was prepared as a prototype. An edge portion of a discoid truer was ground to be formed into a groove shape of the metal grinding stone by the groove of the metal grinding stone without being relatively inclined. A configuration of the truer is as shown in the following Table 1.

TABLE 1

| Constituents | Component names | Contents (wt %) |
| --- | --- | --- |
| Abrasive grains | Silicon carbide | 70% |
| Binder | Phenol resin | 28% |
| Filler | Clay-based filler | 1% |
| Others | Carbon black | 1% |

The truer having the edge portion formed as explained above was held on an adsorption table of a helical chamfering machine, and a periphery of an obliquely attached resin grinding stone (main components: a phenol resin, diamond abrasive grains) was subjected to helical grinding, thereby forming a groove on the periphery of the resin grinding stone.

COMPARATIVE EXAMPLE 1

A metal grinding stone having a vertical symmetrical groove with both upper and lower angles of 22 degrees was prepared as a prototype. An edge portion of a discoid truer was ground to be formed into a groove shape of the metal grinding stone by the groove of the metal grinding stone, and a periphery of a resin grinding stone was subjected to helical grinding by using the truer to form a groove. It is to be noted that configurations of materials of the metal grinding stone, the truer, and the resin grinding stone are the same as those of Example 1.

<Chamfer Portion of Wafer after Helical Grinding>

An edge portion of a silicon wafer obtained by slicing a silicon single crystal ingot grown based on a Czochralski method was subjected to rough chamfering.

This silicon wafer was held on an adsorption table of a helical chamfering machine including the resin grinding stone according to Example 1, and a chamfer portion of the wafer was precisely ground by the groove formed on the periphery of the resin grinding stone based on helical grinding.

Helical grinding for the chamfer portion was performed with respect to 50 silicon wafers as described above, and upper and lower angles of the chamfer portion and a width of a front end of the chamfer portion of each wafer after grinding were measured. A chamfered shape measuring unit (an edge profiler) manufactured by Kobelco Research Institute, Inc. was used for measurement.

Figure 6:
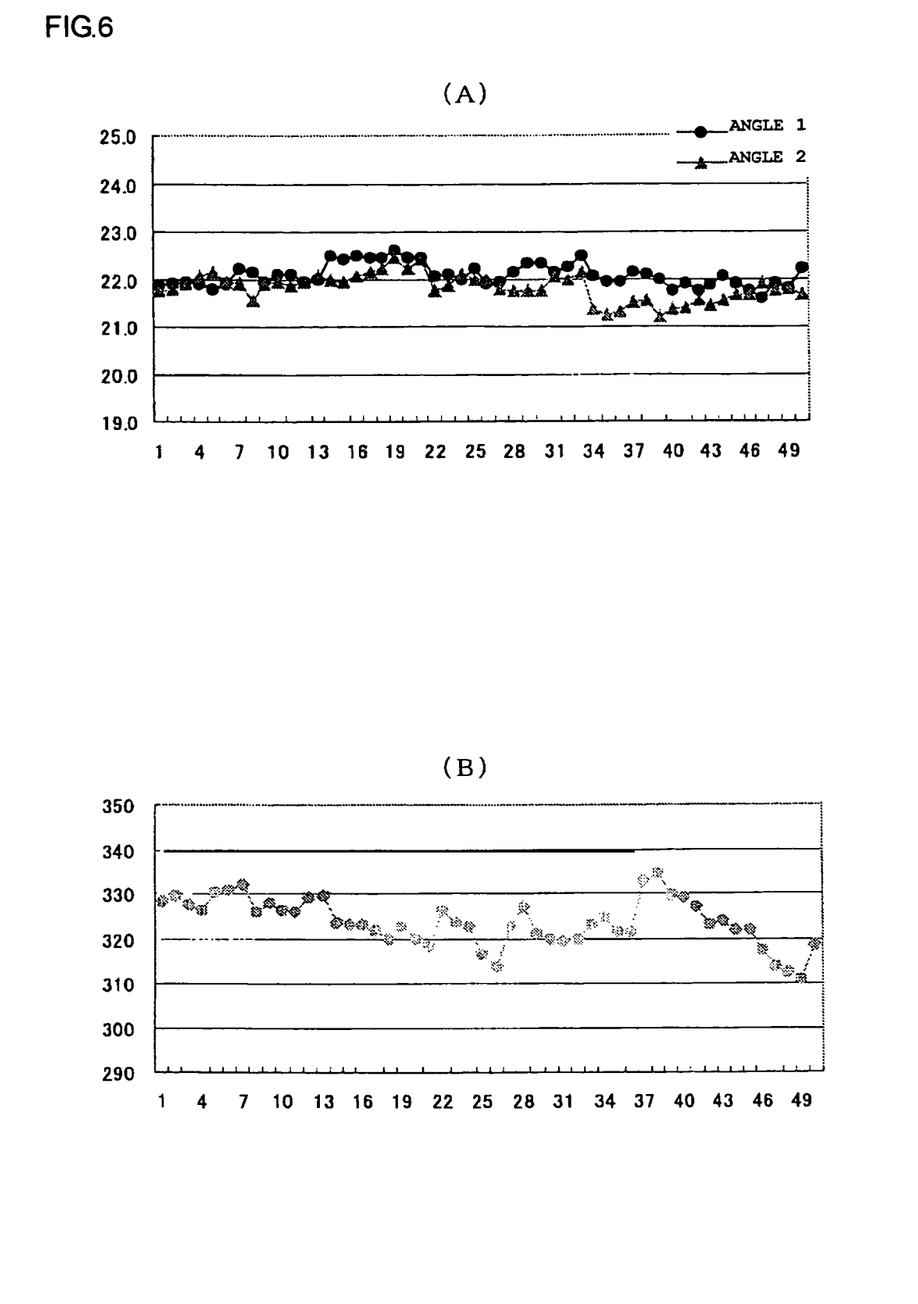
FIG. 6 is graphs showing a shape of the chamfer portion after the chamfer portion of the silicon wafer is subjected to helical grinding using a resin grinding stone according to Example 1, where (A) shows upper and lower angles and (B) shows a width of an end face.

FIG. 6(A) shows a number of each machined wafer and upper and lower angles of the chamfer portion of each wafer after precise grinding using the resin grinding stone. Both the upper and lower angles of the chamfer portion of each wafer were close to a target value (22 degrees) to form a substantially symmetrical shape, and the margin of error of both the upper and lower angles were within ±1 degree.

Furthermore, FIG. 6(B) shows a measurement result of a width of a front end of each chamfer portion, and the respective widths slightly fluctuate near a target value (320 μm), but they were averagely very close to the target value.

On the other hand, a chamfer portion of a silicon wafer was likewise subjected to helical grinding by using a helical chamfering machine including the resin grinding stone fabricated in Comparative Example 1, and upper and lower angles of the chamfer portion and a width of a front end of the chamfer portion of each wafer after grinding were measured.

Figure 7:
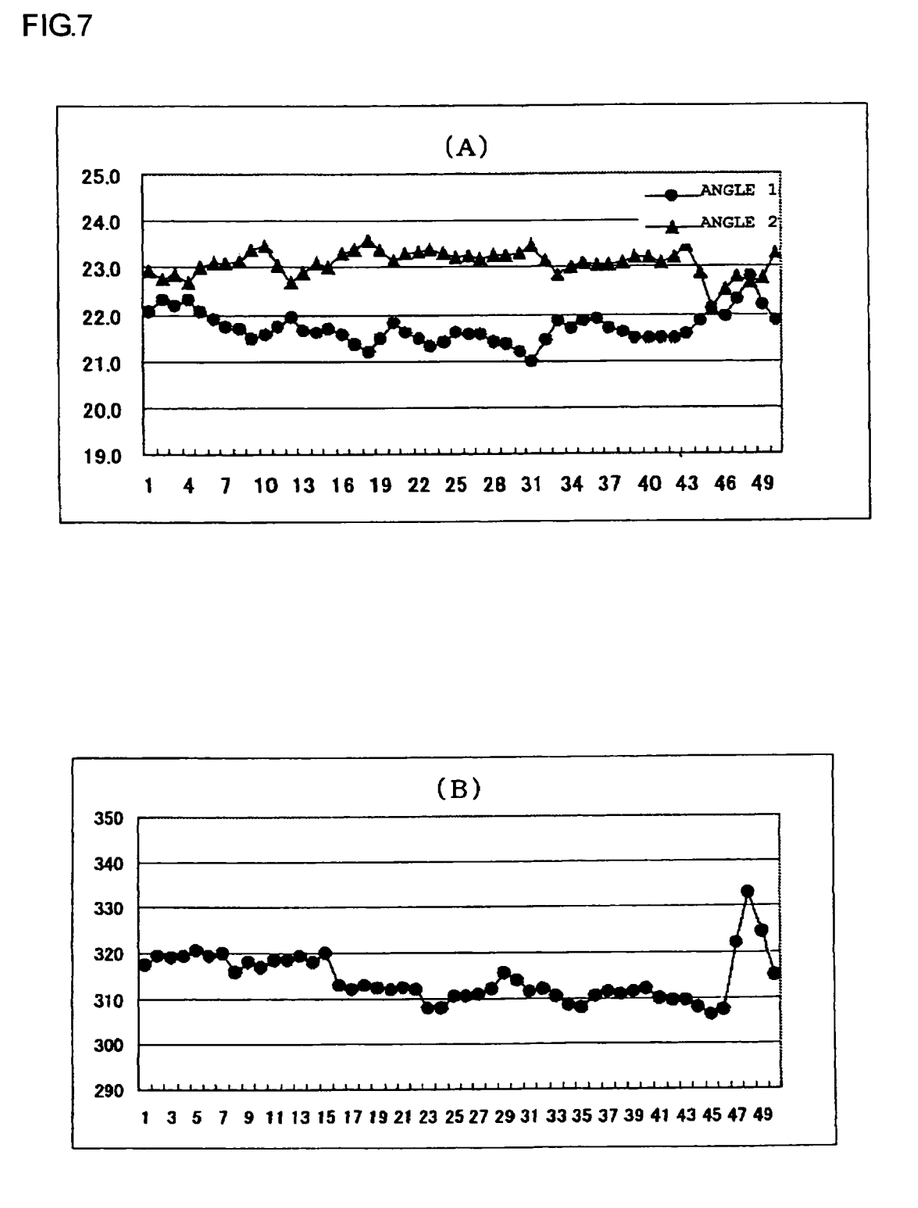
FIG. 7 is graphs showing a shape of the chamfer portion after the chamfer portion of the silicon wafer is subjected to helical grinding using a resin grinding stone according to Comparative Example 1, where (A) shows upper and lower angles and (B) shows a width of an end face.

FIG. 7(A) shows a number of each machined wafer and upper and lower angles of the chamfer portion of each wafer after precise grinding using the resin grinding stone. Both the upper and lower angles of the chamfer portion greatly deviate from the target value (22 degrees), most of the lower angles exceed 23 degrees, and it can be understood that each chamfer portion was formed into a vertically asymmetrical shape.

Moreover, as shown in FIG. 7(B), front ends of the most chamfer portions of about the 20th and subsequent wafers had widths that are approximately 10 μm smaller than the target value (320 μm).

<Number of Machined Wafer Per a Truing>

A chamfer portion of each silicon wafer was continuously machined by using each of the resin grinding stones fabricated in Example 1 and Comparative Example 1. Additionally, the chamfer portion of the silicon wafer was also continuously machined under the same conditions as those in Example 1 except that rough grinding is performed to form the chamfer portion of the silicon wafer into a vertically asymmetrical shape (Example 2). It is to be noted that each truer was used to appropriately perform correction (truing) of a groove when the condition that an outer circumference surface width, an outer circumference angle, and an outer circumference shape were predetermined value respectively was not satisfied by a reduction of grinding performance.

Figure 8:
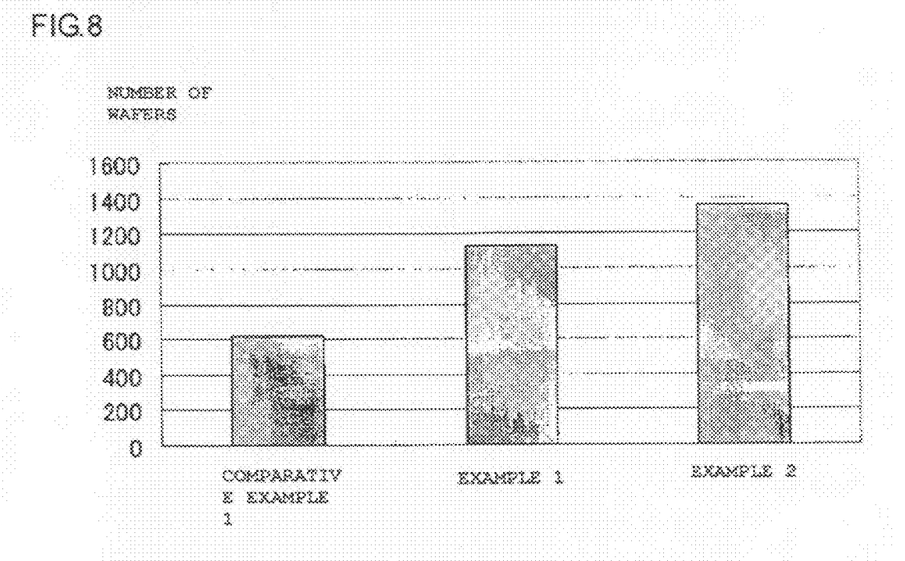
FIG. 8 is a graph showing the number of silicon wafers machined per truing operation.

FIG. 8 shows the number of silicon wafers that were able to be machined per a truing using each resin grinding stone. As shown in FIG. 8, 1000 silicon wafers exceeding a target number were able to be chamfered per one truing operation using each of the resin grinding stones according to Examples 1 and 2.

On the other hand, only approximately 600 silicon wafers were able to be chamfered per one truing operation by using the resin grinding stone according to Comparative Example 1.

<Life of Resin Grinding Stone>

Figure 9:
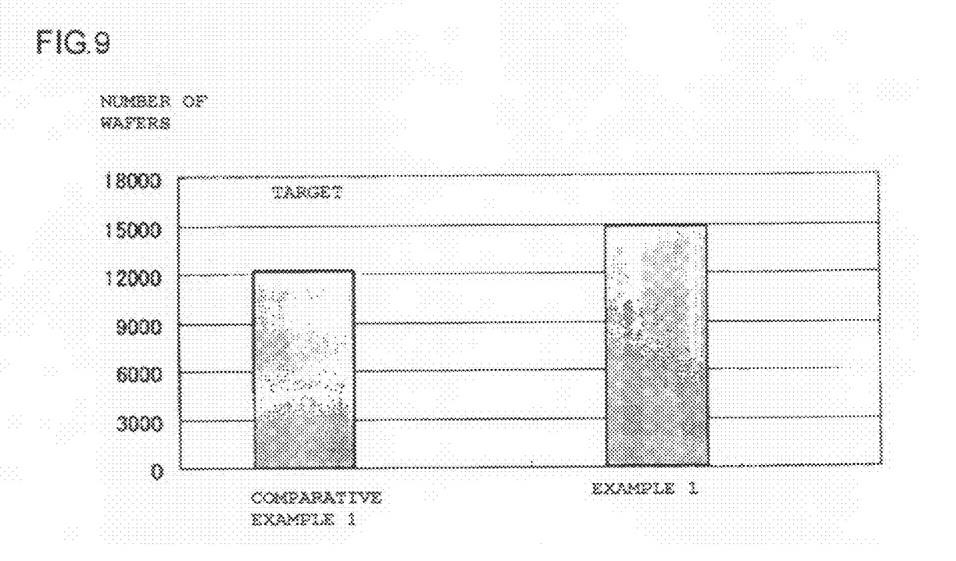
FIG. 9 is a graph showing the number of silicon wafers being able to machine by using one resin grinding stone.

FIG. 9 shows the number of silicon wafers that were able to machined by repeating truing of the resin grinding stone using each of the resin grinding stone according to Example 1 and the resin grinding stone according to Comparative Example 1 to continuously machine a chamfer portion of each silicon wafer until the resin grinding stone had a predetermined or smaller diameter to be disabled due to wearing out. As can be understood from this drawing, the number of wafers machined by the resin grinding stone according to Example 1 was approximately 25% higher than the number of wafers machined by the resin grinding stone according to Comparative Example 1.

It is to be noted that the present invention is not restricted to the foregoing examples. The examples are just exemplifications, and any examples that have substantially the same structures as those in the technical concept described in claims according to the present invention and demonstrate the same functions and performs are included in the technical scope of the present invention.

For example, although the case where the resin grinding stone is inclined at a predetermined angle to perform helical grinding have been explained in the above embodiment, both the wafer and the resin grinding stone and both the truer and the resin grinding stone may be relatively inclined to perform helical grinding, and for example, the present invention can be also applied to a case where the resin grinding stone is vertically held and the wafer is inclined to perform helical grinding.

Further, the semiconductor wafer to be subjected to helical grinding is not limited to the silicon wafer. The present invention can be likewise applied to a case where a chamfer portion of any other semiconductor wafer is subjected to helical grinding.

Furthermore, although the case that the metal grinding stone is used as the first grinding stone and the resin grinding stone is used as the second grinding stone has been explained as the preferred embodiment in the above embodiment, the first and second grinding stones are not limited thereto, and grinding stones formed of other materials may be used as long as the first grinding stone can be used to machine the truer, the truer can be used to form the groove on the second grinding stone, and the chamfer portion of the wafer can be precisely ground by using the groove of the second grinding stone.

The invention claimed is:

1. A method for machining a chamfer portion of a semiconductor wafer that is a method for subjecting a roughly ground chamfer portion of a semiconductor wafer to helical grinding by relatively inclining the wafer and a second grinding stone to perform precise grinding, comprising: forming an edge portion of a discoid truer into a vertically asymmetrical groove shape of a first grinding stone by using the first grinding stone having a vertically asymmetrical groove formed on a periphery thereof to grind the edge portion of the truer without being relatively inclined; forming a groove on a periphery of the second grinding stone by relatively inclining the truer and the second grinding stone to subject the second grinding stone to helical grinding; and precisely grinding the chamfer portion of the wafer based on helical grinding by relatively inclining the semiconductor wafer with respect to a direction of the groove formed on the periphery of the second grinding stone.

2. The method for machining a chamfer portion of a semiconductor wafer according to claim 1, wherein a metal grinding stone is used as the first grinding stone, and a resin grinding stone is used as the second grinding stone.

3. The method for machining a chamfer portion of a semiconductor wafer according to claim 1, wherein, when the truer and the second grinding stone are relatively inclined to subject the second grinding stone to helical grinding, upper and lower angles of the groove of the first grinding stone are determined in such a manner that the vertically asymmetrical shape of the edge portion of the truer can be offset and a vertically symmetrical groove can be formed on the periphery of the second grinding stone.

4. The method for machining a chamfer portion of a semiconductor wafer according to claim 2, wherein, when the truer and the second grinding stone are relatively inclined to subject the second grinding stone to helical grinding, upper and lower angles of the groove of the first grinding stone are determined in such a manner that the vertically asymmetrical shape of the edge portion of the truer can be offset and a vertically symmetrical groove can be formed on the periphery of the second grinding stone.

5. The method for machining a chamfer portion of a semiconductor wafer according to claim 1, wherein a material formed by combining abrasive grains consisting of a silicon carbide through a phenol resin is used as the truer.

6. The method for machining a chamfer portion of a semiconductor wafer according to claim 2, wherein a material formed by combining abrasive grains consisting of a silicon carbide through a phenol resin is used as the truer.

7. The method for machining a chamfer portion of a semiconductor wafer according to claim 3, wherein a material formed by combining abrasive grains consisting of a silicon carbide through a phenol resin is used as the truer.

8. The method for machining a chamfer portion of a semiconductor wafer according to claim 4, wherein a material formed by combining abrasive grains consisting of a silicon carbide through a phenol resin is used as the truer.

9. The method for machining a chamfer portion of a semiconductor wafer according to claim 1, wherein a silicon wafer is machined as the semiconductor wafer.

10. The method for machining a chamfer portion of a semiconductor wafer according to claim 1, wherein a target value of the upper and lower angles of the chamfer portion of the semiconductor wafer after precise grinding based on helical grinding using the second grinding stone is set to 22 degrees.

11. The method for machining a chamfer portion of a semiconductor wafer according to claim 2, wherein a target value of the upper and lower angles of the chamfer portion of the semiconductor wafer after precise grinding based on helical grinding using the second grinding stone is set to 22 degrees.

12. The method for machining a chamfer portion of a semiconductor wafer according to claim 3, wherein a target value of the upper and lower angles of the chamfer portion of the semiconductor wafer after precise grinding based on helical grinding using the second grinding stone is set to 22 degrees.

13. The method for machining a chamfer portion of a semiconductor wafer according to claim 4, wherein a target value of the upper and lower angles of the chamfer portion of the semiconductor wafer after precise grinding based on helical grinding using the second grinding stone is set to 22 degrees.

14. The method for machining a chamfer portion of a semiconductor wafer according to claim 5, wherein a target value of the upper and lower angles of the chamfer portion of the semiconductor wafer after precise grinding based on helical grinding using the second grinding stone is set to 22 degrees.

15. The method for machining a chamfer portion of a semiconductor wafer according to claim 6, wherein a target value of the upper and lower angles of the chamfer portion of the semiconductor wafer after precise grinding based on helical grinding using the second grinding stone is set to 22 degrees.

16. The method for machining a chamfer portion of a semiconductor wafer according to claim 7, wherein a target value of the upper and lower angles of the chamfer portion of the semiconductor wafer after precise grinding based on helical grinding using the second grinding stone is set to 22 degrees.

17. The method for machining a chamfer portion of a semiconductor wafer according to claim 8, wherein a target value of the upper and lower angles of the chamfer portion of the semiconductor wafer after precise grinding based on helical grinding using the second grinding stone is set to 22 degrees.

18. The method for machining a chamfer portion of a semiconductor wafer according to claim 9, wherein a target value of the upper and lower angles of the chamfer portion of the semiconductor wafer after precise grinding based on helical grinding using the second grinding stone is set to 22 degrees.

19. The method for machining a chamfer portion of a semiconductor wafer according to claim 1, wherein rough grinding is performed before the chamfer portion of the semiconductor wafer is subjected to precise grinding based on helical grinding using the second grinding stone so that the chamfer portion of the wafer can have the vertically asymmetrical shape.

20. The method for machining a chamfer portion of a semiconductor wafer according to claim 18, wherein rough grinding is performed before the chamfer portion of the semiconductor wafer is subjected to precise grinding based on helical grinding using the second grinding stone so that the chamfer portion of the wafer can have the vertically asymmetrical shape.

21. A method for correcting a groove shape of a second grinding stone that is a method for correcting a groove shape of a second grinding stone when a semiconductor wafer having a roughly ground chamfer portion and the second grinding stone having a groove formed on a periphery thereof are relatively inclined and the chamfer portion of the wafer is subjected to helical grinding using the groove of the second grinding stone to perform precise grinding, comprising: forming an edge portion of a discoid truer into a vertically asymmetrical groove shape of a first grinding stone by using the first grinding stone having a vertically asymmetrical groove formed on a periphery thereof to grind the edge portion of the truer; and correcting the groove shape of the second grinding stone by relatively inclining the truer and the second grinding stone to subject the second grinding stone to helical grinding.

* * * * *